United States Patent
Waldrop et al.

(10) Patent No.: US 12,223,999 B2
(45) Date of Patent: Feb. 11, 2025

(54) SYNCHRONOUS INPUT BUFFER CONTROL USING A WRITE SHIFTER

(71) Applicant: Micron Technology, Inc., Boise, ID (US)

(72) Inventors: William Chad Waldrop, Allen, TX (US); David R. Brown, Allen, TX (US); Guy S. Perry, IV, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 197 days.

(21) Appl. No.: 17/853,517

(22) Filed: Jun. 29, 2022

(65) Prior Publication Data

US 2024/0005980 A1  Jan. 4, 2024

(51) Int. Cl.
*G11C 11/4093* (2006.01)
(52) U.S. Cl.
CPC ............ *G11C 11/4093* (2013.01)
(58) Field of Classification Search
CPC .................................. G11C 11/4093
USPC ..................................... 365/189.11
See application file for complete search history.

(56) References Cited

U.S. PATENT DOCUMENTS 10,366,742 B1 * 7/2019 Penney ............... G11C 7/106
2019/0259433 A1 * 8/2019 Penney ......... H04L 25/03057

* cited by examiner

*Primary Examiner* — Anthan Tran
(74) *Attorney, Agent, or Firm* — Fletcher Yoder, P.C.

(57) ABSTRACT

A memory device includes a command interface configured to receive write commands from a host device. The memory device also includes an input buffer configured to buffer data from the host device. The memory device further includes a write shifter configured to receive a first write command of the write commands and to shift the first command through the write shifter. The write shifter is also configured to cause the input buffer to be disabled after a first threshold of clock cycles when the first write command has shifted through the write shifter. The write shifter is additionally configured to receive a second write command and prevent the input buffer from being re-enabled until the second write command has shifted through a second threshold of stages of the write shifter.

25 Claims, 10 Drawing Sheets

SYNCHRONOUS INPUT BUFFER CONTROL USING A WRITE SHIFTER

BACKGROUND

Field of the Present Disclosure

Embodiments of the present disclosure relate generally to memory devices. More specifically, embodiments of the present disclosure relate to enabling and disabling an input buffer of a memory device.

Description of Related Art

Generally, a computing system may include electronic devices that, in operation, communicate information via electrical signals. For example, a computing system may include a processor communicatively coupled to a memory device, such as a dynamic random-access memory (DRAM) device, a ferroelectric random-access memory (FeRAM) device, another random-access memory (RAM) device, and/or a hybrid device that incorporates more than one type of RAM. In this manner, the processor may communicate with the memory device, for example, to retrieve executable instructions, retrieve data to be processed, by the processor, and/or store data output from the processor.

The host device (e.g., processor) may send data and commands to the memory devices. The memory devices utilize input buffers to capture input data received from the host device. These input buffers may be selectively disabled and enabled using input buffer enable signals. For instance, a data strobe (DQS) input buffer used to buffer the DQS received from the host device that is used to assist in capturing data received from the host device. The DQS may also be divided into 4 phases using a DQS clock generator. A data (DQ) input buffer may be used to buffer data from the host device. At the conclusion of a write command, the data input buffer may be disabled to save power when there is a relatively large separation (e.g., minimum separation of 25 tCks) between write commands. During this input buffer disable period, the DQS clock generator will reset to synchronize the state of the DQS clocks for the next incoming write. It is possible that at a certain write-to-write timings, this input buffer disable period may be too short to properly reset the DQS clock generator in all operating conditions and may result in a partial reset condition. This partial reset of the DQS clock generator may be related to asynchronous behavior of the input buffer enable circuitry that causes a failure (e.g., a sliver fail) in the memory device with the data input buffer dropping the first data bits of the second write command after the truncated input buffer disable.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously discussed, truncated input buffer disable periods may cause memory failures where a portion of input bits are dropped due to a partial reset of a four-phase DQS clock generator. To address this failure, input buffer control circuitry may implement a synchronous solution for enabling and disabling the data and DQS input buffers to ensure that the data input buffer enable behavior is deterministic and to ensure that the data and DQS input buffers have sufficient reset pulse durations. Specifically, input buffer control circuitry may ensure that input buffer disabling only occurs when the spacing between write commands (write-to-write spacing) is greater than or equal to a number (e.g., 31) of tCks. The input buffer control circuitry may also provide a minimum pulse width (e.g., of 3 tCks) of a disable pulse when there is a write-to-write spacing equal to or greater than the number. The input buffer control circuitry further may increase the disable pulse width by an additional tCk for each additional tCk of write-to-write spacing thereby relaxing with larger write-to-write spacings and/or slower tCks.

Figure 1:
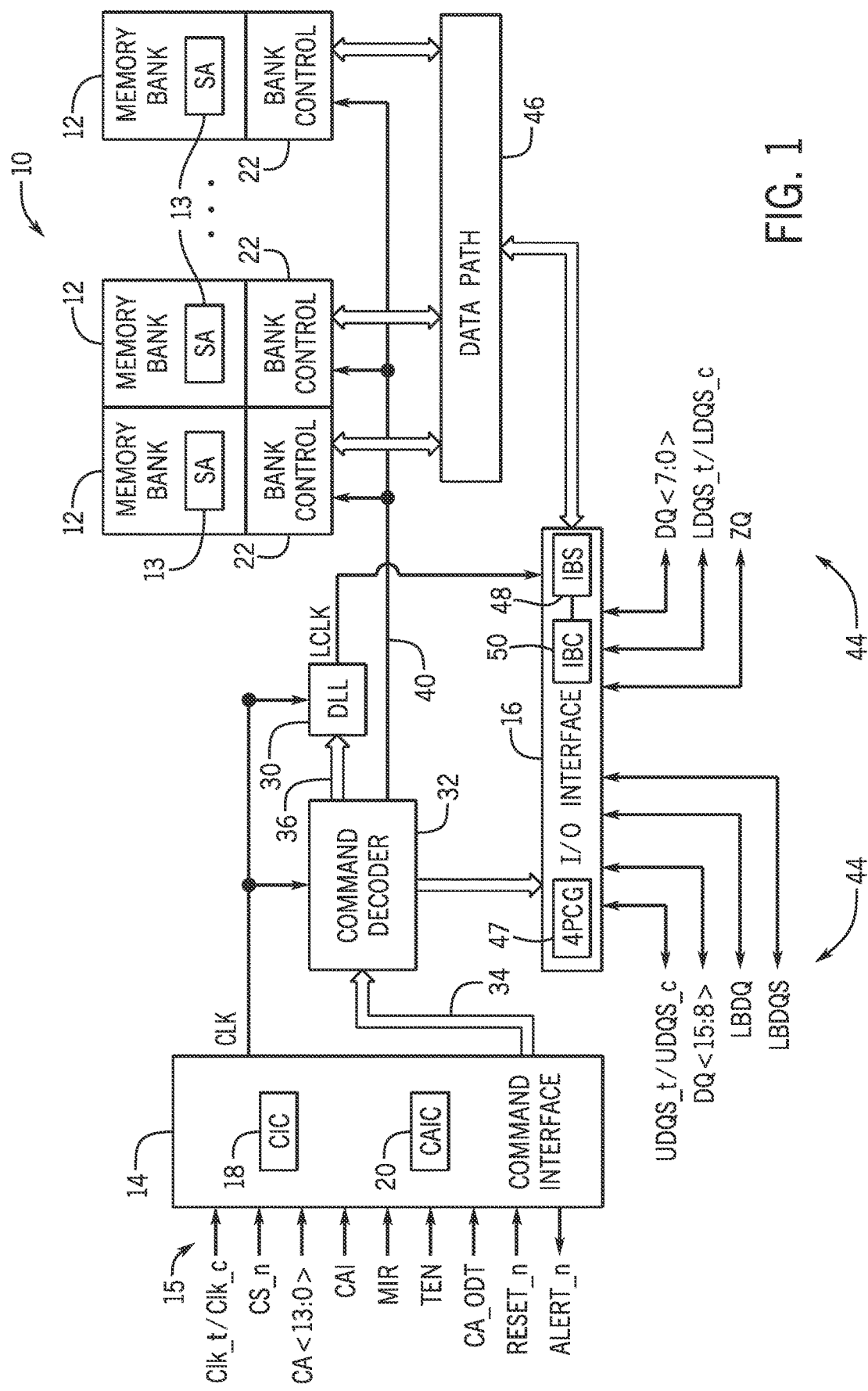
FIG. 1 is a simplified block diagram illustrating certain features of a memory device having input buffers and input buffer control circuitry, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5

SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory banks 12 and/or bank control blocks 22 include sense amplifiers 13. As previously noted, sense amplifiers 13 are used by the memory device 10 during read operations. Specifically, read circuitry of the memory device 10 utilizes the sense amplifiers 13 to receive low voltage (e.g., low differential) signals from the memory cells of the memory banks 12 and amplifies the small voltage differences to enable the memory device 10 to interpret the data properly.

The memory device 10 may include a command interface 14 and an input/output (I/O) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, the true clock signal Clk_t and the bar clock signal Clk_c. The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 18 receives the true clock signal Clk_t and the bar clock signal Clk_c and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes the bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20, which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the datapath 46, which includes a plurality of bi-directional data buses. Data TO signals, generally referred to as DQ signals, are generally transmitted and received in one or more bi-directional data busses. For certain memory devices, such as a DDR5 SDRAM memory device, the TO signals may be divided into upper and lower bytes. For instance, for a x16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

The DQS may be divided into multiple (e.g., 4 phases) using a 4-phase clock generator (4 PCG) 47 that may output successive pulses of the DQS to different clocks to generate different phases. Furthermore, the DQ and DQS signals may be buffered in the memory device 10 using respective input buffers (IBs) 48. Input buffer control circuitry (IBC) 50 may enable and disable the input buffers 48. However, as previously noted, some input buffer disable periods that are shorter than a certain width (e.g., 1-4 tCks) may cause the 4 PCG 47 to be partially reset which may induce the input buffer(s) 48 (e.g., data input buffer) to fail to buffer/drop at least some data bits transmitted via the DQ signals. Thus, as discussed below, the input buffer control circuitry 50 may enforce a minimum write-to-write before disabling the input buffer and enforce a minimum pulse width of input buffer disable periods when disables occur to ensure the full or proper reset of the 4 PCG 47.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback data signal (LBDQ) and loopback strobe signal (LBDQS) may be provided to the memory device 10 through the IO interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a loopback data pin. This is generally intended to be used to monitor the data captured by the memory device 10 at the IO interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description. Furthermore, although the foregoing discusses the memory device as being a DDR5 device, the memory device 10 may be any suitable device (e.g., a double data rate type 4 DRAM (DDR4), a ferroelectric RAM device, or a combination of different types of memory devices).

Figure 2:
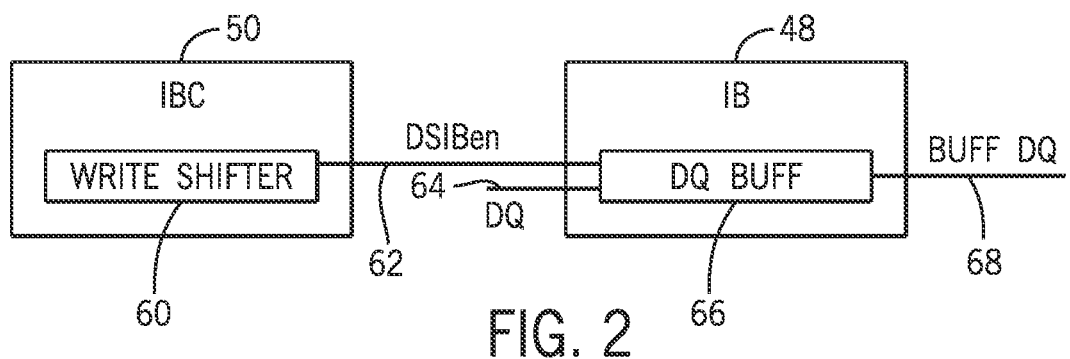
FIG. 2 is a block diagram of an embodiment of the input buffers and input buffer control circuitry of FIG. 1 having a write shifter, according to an embodiment of the present disclosure.

FIG. 2 is a diagram showing the input buffer control circuitry 50 including/utilizing a write shifter 60 to generate a DSIBen signal 62 that controls when DQ 64 may be buffered in the DQ input buffer (DQ Buff) 66 to output a buffered DQ signal (BuffDQ) 68. As previously noted, the DSIBen signal 62 may be synchronous and deterministic with disabling the input buffer when write-to-write spacing is less than a number (e.g., 31 tCk) and may ensure that the disable pulse is at least a minimum width (e.g., 2 or 3 tCk). In some embodiments, the write shifter 60 may be utilized for other purposes during other operations of the memory device 10 and/or may be dedicated to generating the DSIBen signal 62.

Figure 3A:
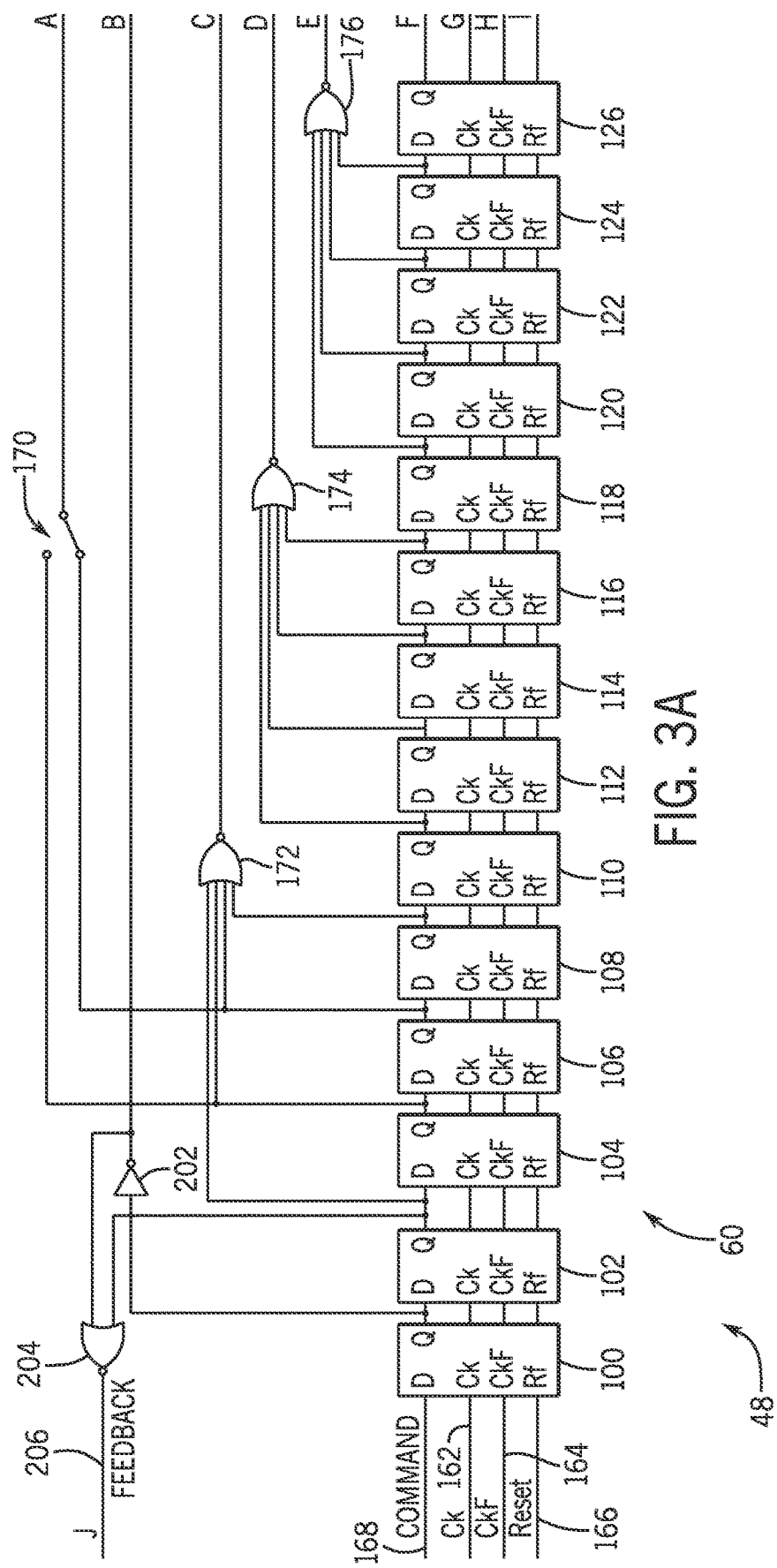
FIGS. 3A and 3B, collectively referred to as FIG. 3, is a circuit diagram of the write shifter of FIG. 2, according to an embodiment of the present disclosure.
Figure 3B:
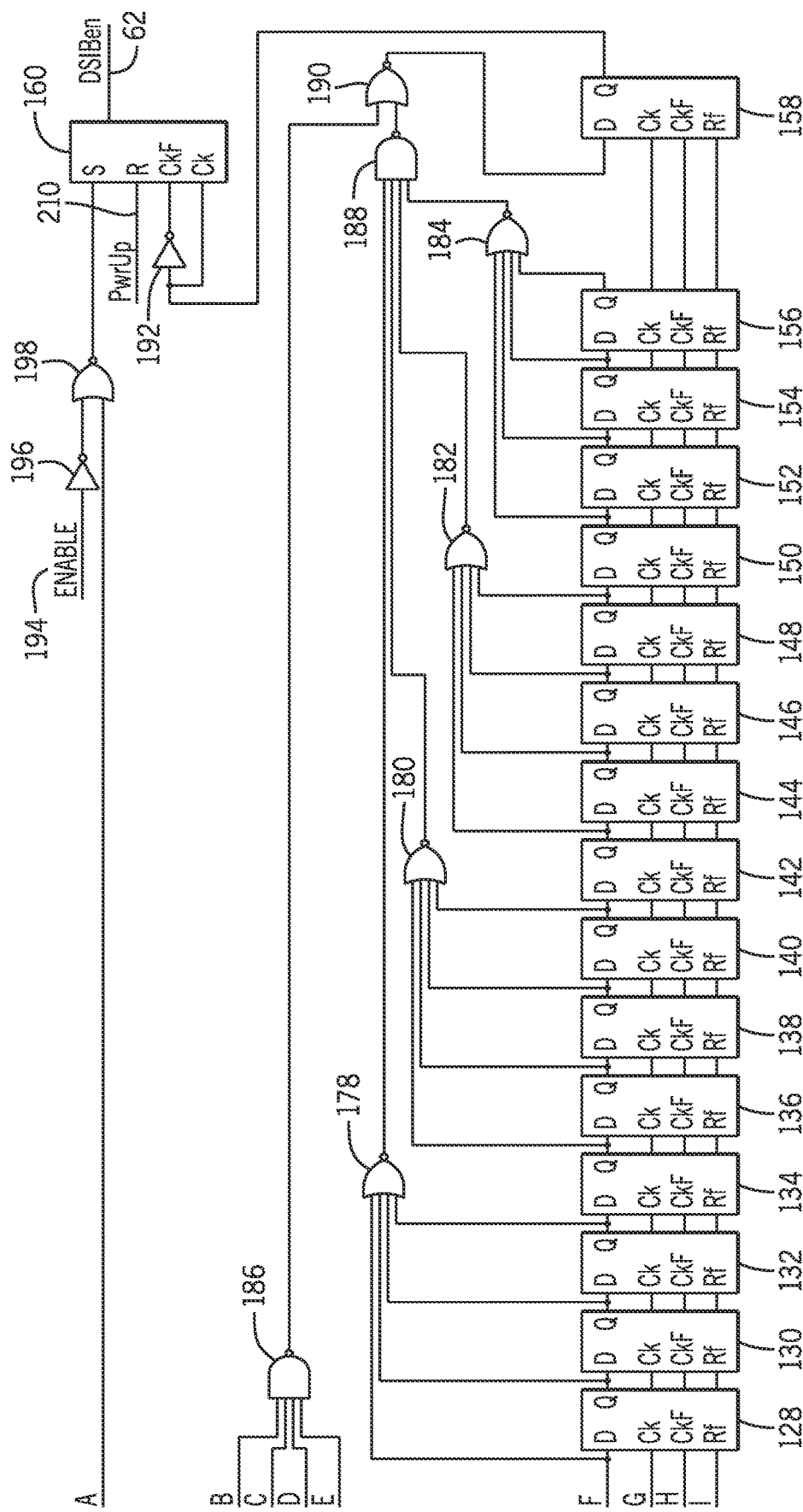

FIGS. 3A and 3B, collectively referred to as FIG. 3, is a circuit diagram of the input buffer control circuitry 48 including the write shifter 60. As illustrated, the write circuitry includes flip-flops 100, 102, 104, 106, 108, 110, 112, 114, 116, 118, 120, 122, 124, 126, 128, 130, 132, 134, 136, 138, 140, 142, 144, 146, 148, 150, 154, 156, 158, and 160, collectively referred to as flip-flops 100-160, that are serially connected. The write shifter 60 receives a command signal 168 indicative of an incoming write signal, a system clock (Ck) 162 to control clocking of the flip-flops 100-160, a complementary clock (CkF) 164 that is complementary to the Ck 162 and used to control clocking of the flip-flops 100-160, and a reset signal 166 used to reset the flip-flops 100-160 (e.g., due to a power up of the memory device 10).

The write shifter 60 also includes a NOR gate 172 that receives the outputs of the flip-flops 102, 104, 106, and 108, a NOR gate 174 that receives the outputs of the flip-flops 110, 112, 114, and 116, a NOR gate 176 that receives the outputs of the flip-flops 118, 120, 122, and 124, a NOR gate 178 that receives the outputs of the flip-flops 126, 128, 130, and 132, a NOR gate 180 that receives the outputs of the flip-flops 134, 136, 138, and 140, a NOR gate 182 that receives the outputs of the flip-flops 142, 144, 146, and 148, and a NOR gate 184 that receives the outputs of the flip-flops 150, 152, 154, and 156. Furthermore, the write shifter 60 includes a NAND gate 186 that receives the outputs of an inverter 202 and the NOR gates 172, 174, and 176 as its inputs and performs a logic NAND on the inputs. Additionally, the write shifter 60 includes a NAND gate 188 that receives the outputs of the NOR gates 178, 180, 182, and 184 as its inputs and performs a logic NAND on the inputs. A NOR gate 190 receives the outputs of the NAND gates 186 and 188 as inputs and performs a NOR operation on the inputs. In other words, the output of the NOR gate 190 is a logic OR function of each stage of the write shifter 60 to ensure that the input buffer(s) 48 will not be disabled with a write command in the pipeline. Furthermore, the input buffer control circuitry 50 widens a 1 tCk-wide pulse on the command signal 168 to 2 tCk. The 2 tCk-wide write command in the shifter allows the OR operation of the write command through the shifter to operate without glitches as the write command travels through the write shifter due to an overlap. This extension also extends the write enable duration by 1 tCk. In the illustrated embodiment, the write shifter 60 includes 30 stages that provide 30 tCk plus the additional 1 tCk due to the 1 tCk extension of the write command. In other embodiments, the number of stages may be different than that which is illustrated without changing the operation of the input buffer control techniques discussed herein.

The output of NOR gate 190 (e.g., the logic OR function of all of the stages) is transmitted to the data input of the flip-flop 158 that is synchronously captured with the Ck 162 to ensure that the flip-flop 160 does not see a clock glitch for the case where a write command is entering the write shifter 60 while a write command is leaving the write shifter 60 on the same cycle. The latched output of the flip-flop 158 is transmitted as a clock input of the flip-flop 160. An inverter 192 may be used to provide a complementary clock using the output of the flip-flop 158. The flip-flop 160 acts as an SR latch that has a power up (PwrUp) signal 210 that is used to reset the flip-flop 160 when the memory device 10 is powered on. The input to the set pin of the flip-flop 160 is based on a tap point between flip-flops of the write shifter 60. The location may be set (e.g., 2, 3, or 4 tCks) or, as illustrated, may be selected using a switch 170 (or multiplexer). The turn-on tap point determines the enable time for the input buffer(s) 48 and sets a minimum disable pulse width. The output of the switch 170 (i.e., the turn-on tap point) is transmitted to a NOR gate 198 coupled to the active low set pin of the flip-flop 200. The other input to the NOR gate 198 may be an active low testmode enable signal 194 (that may be inverted using an inverter 196) that may be used to force the input buffer to be enabled for testing whenever the signal is low. In other words, the active low testmode enable signal 194 circumvents the normal enable timing and the power savings of the enable for the testmode. Using these inputs, when a number (e.g., >31) of tCks exist between write commands, the DSIBen signal 62 may be used to disable the input buffer(s) 48. Furthermore, if the DSIBen signal 62 has a disable pulse, the write shifter 60 ensures that the disable pulse is longer in duration than a threshold (e.g., 2, 3, or 4 tCks). In other words, the DSIBen signal 62 may re-enable the disabled input buffer(s) 48 only after the threshold duration after a subsequent write command has been received and shifted for the threshold of tCks. Thus, even if the DSIBen signal 62 was disabled on the tCk before the new write command is received, the DSIBen signal 62 is not re-enabled until the threshold duration has been met for the disable pulse alleviating the risks of a partial reset of the 4 PCG 47.

The write shifter 60 may also include a NOR gate 204 that performs a NOR operation on an output of the flip-flop 102 and the output of the inverter 202 to generate a feedback signal 206 that is used for stretching as is discussed below.

Figure 4:
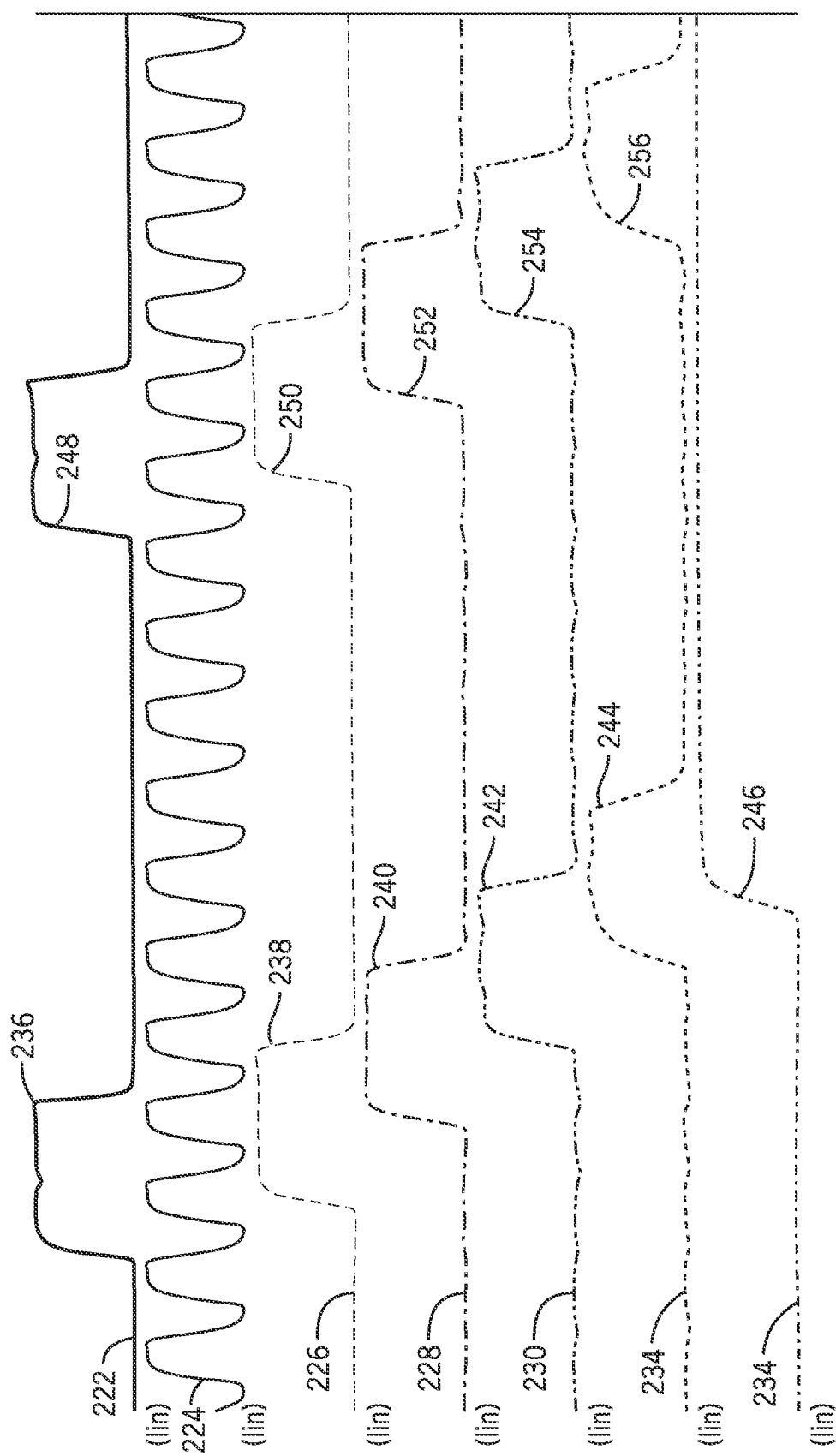
FIG. 4 is a graph of operation of the write shifter of FIG. 3 showing an input buffer enable signal, according to an embodiment of the present disclosure.

FIG. 4 is a graph 220 showing an embodiment of operation of the write shifter 60. As illustrated, the graph 220 includes a line 222 that represents the command signal 168. The graph 220 also includes a line 224 that represents the Ck 162 received at the flip-flop 100 and includes a line 226 that represents an output of the flip-flop 100. A line 228 represents an output of the flip-flop 102, a line 230 represents an output of the flip-flop 104, and a line 232 represents an output of the flip-flop 106. The graph 220 also includes a line 234 that represents the DSIBen signal 62. As illustrated, a pulse 236 on the command signal 168 is widened to 2 tCk of the Ck 162 and causes a 2-tCk-wide pulse 238 at the output of the flip-flop 100 at the next cycle of the Ck 162. This pulse 238 at the output of the flip-flop 100 causes a pulse 240 at the output of the flip-flop 102 at a next cycle of the Ck 162. In turn, this pulse 240 at the output of the flip-flop 102 causes a pulse 242 at the output of the flip-flop 104 at a next cycle of the Ck 162. Similarly, this pulse 242 at the output of the flip-flop 104 causes a pulse 244 at the output of the flip-flop 106 at a next cycle of the Ck 162. As the output of the flip-flop 106 is used as the turn-on tap point via the switch 170, the pulse 244 causes the DSIBen signal 62 to be asserted, as illustrated by rising edge 246, to enable the input buffer(s) 48.

As illustrated, a pulse 248 on the command signal 168 is widened to 2 tCk and causes a 2-tCk-wide pulse 250 at the output of the flip-flop 100 at the next cycle of the Ck 162. This pulse 250 at the output of the flip-flop 100 causes a pulse 252 at the output of the flip-flop 102 at a next cycle of the Ck 162. In turn, this pulse 252 at the output of the flip-flop 102 causes a pulse 254 at the output of the flip-flop 104 at a next cycle of the Ck 162. Similarly, this pulse 254 at the output of the flip-flop 104 causes a pulse 256 at the output of the flip-flop 106 at a next cycle of the Ck 162. Since the DSIBen signal 62 is already asserted (e.g., is not deasserted as the write-to-write spacing does not exceed the number (e.g., 31)), the DSIBen signal 62 remains asserted.

As previously noted, the width of the pulses is 2 tCk. This extension of the write command in the write shifter enables the pulses to overlap to avoid potential glitches in the logical OR path.

Figure 5:
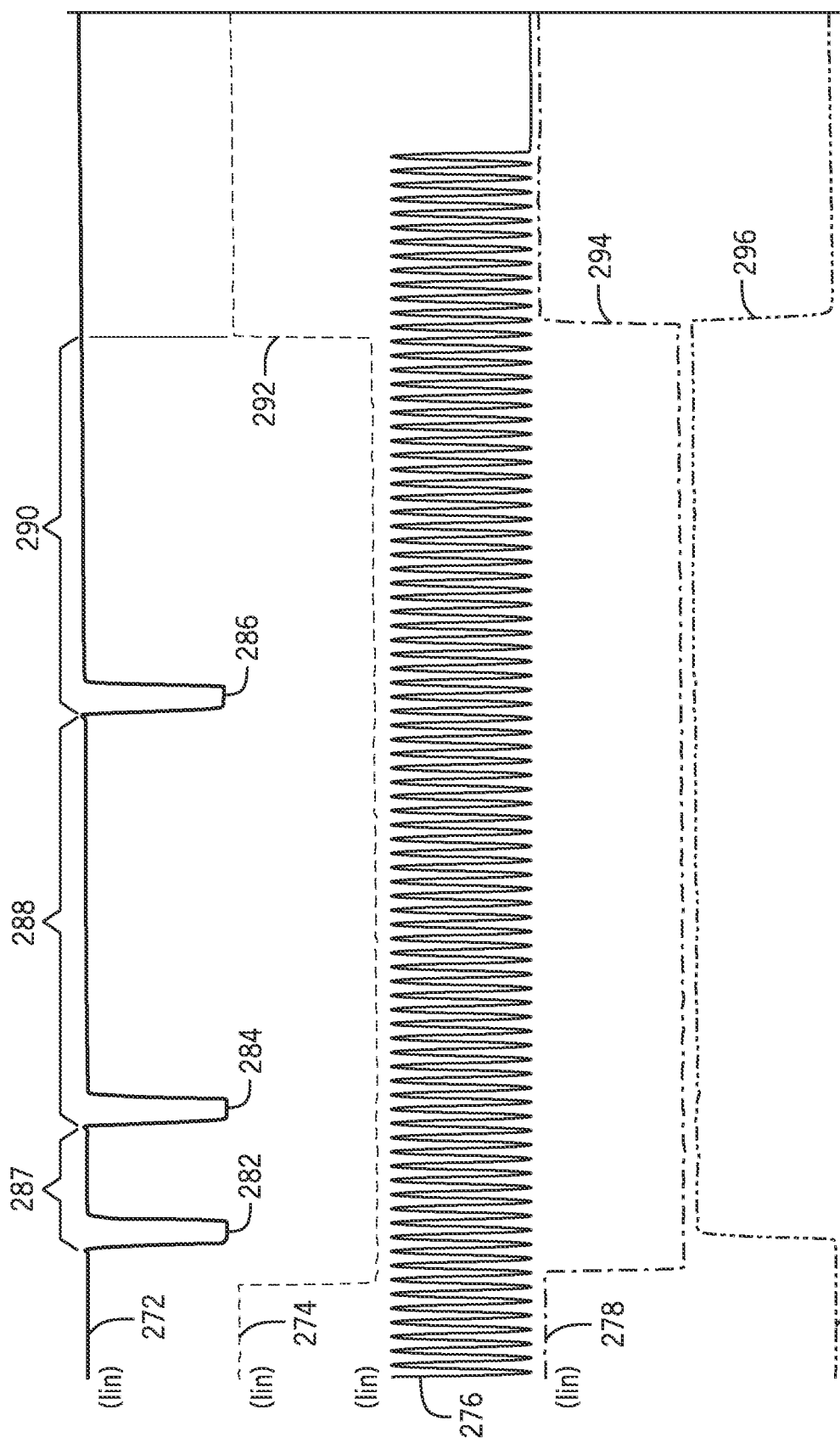
FIG. 5 is a graph of operation of the write shifter of FIG. 3 showing an input buffer enable signal with a write-to-write spacing less than a threshold amount, according to an embodiment of the present disclosure.

FIG. 5 is a graph 270 showing an embodiment of operation of the write shifter 60. The graph 270 includes line 272 to the output of the NOR gate 198 that is used to enable the DSIBen signal 62. The line 272 may be a complementary signal to that represented by the line 222 in FIG. 4. Specifically, an assertion shown by the line 222 corresponds to a pulse to a logic high value while an assertion shown by the line 272 corresponds to a pulse to a logic low value. The graph 270 also includes a line 274 that corresponds to an output of the NOR gate 190 indicating a result of the logical OR operation of all of the stages of the write shifter 60. The graph 270 further includes a line 276 that corresponds to the Ck 162. The line 278 corresponds to the synchronized result of the logical OR operation output from the flip-flop 158. The line 280 corresponds to the DSIBen signal 62 output from the flip-flop 160.

Three pulses 282, 284, and 286 each correspond to write commands entering the write shifter 60. A write-to-write spacing 287 between the pulses 282 and 284 is less (e.g., 8) than the threshold number (e.g., 31) of tCks. Thus, the output of the NOR gate 190 does not transition high after the pulse 282 and before the pulse 284. Similarly, a write-to-write spacing 288 between the pulses 284 and 286 is also less (e.g., than the threshold number of tCks. Accordingly, the NOR gate 190 does not transition high after the pulse 284 and before the pulse 286. After the pulse 286, no other write commands are received for the threshold number (e.g., 31) of tCks. Accordingly, the stages of the write shifter 60 are empty causing a rising edge 292 for the output of the NOR gate 190 to transition high. The rising edge 292 causes the output of the flip-flop 158 represented by the line 278 to transition high as a rising edge 294 at a next clock cycle of the Ck 162. In other words, the flip-flop 158 synchronizes the output of the NOR gate 190 to the Ck 162. This rising edge 294 causes the flip-flop 160 to output the DSIBen signal 62 with a falling edge 296 to disable the input buffer.

Figure 6:
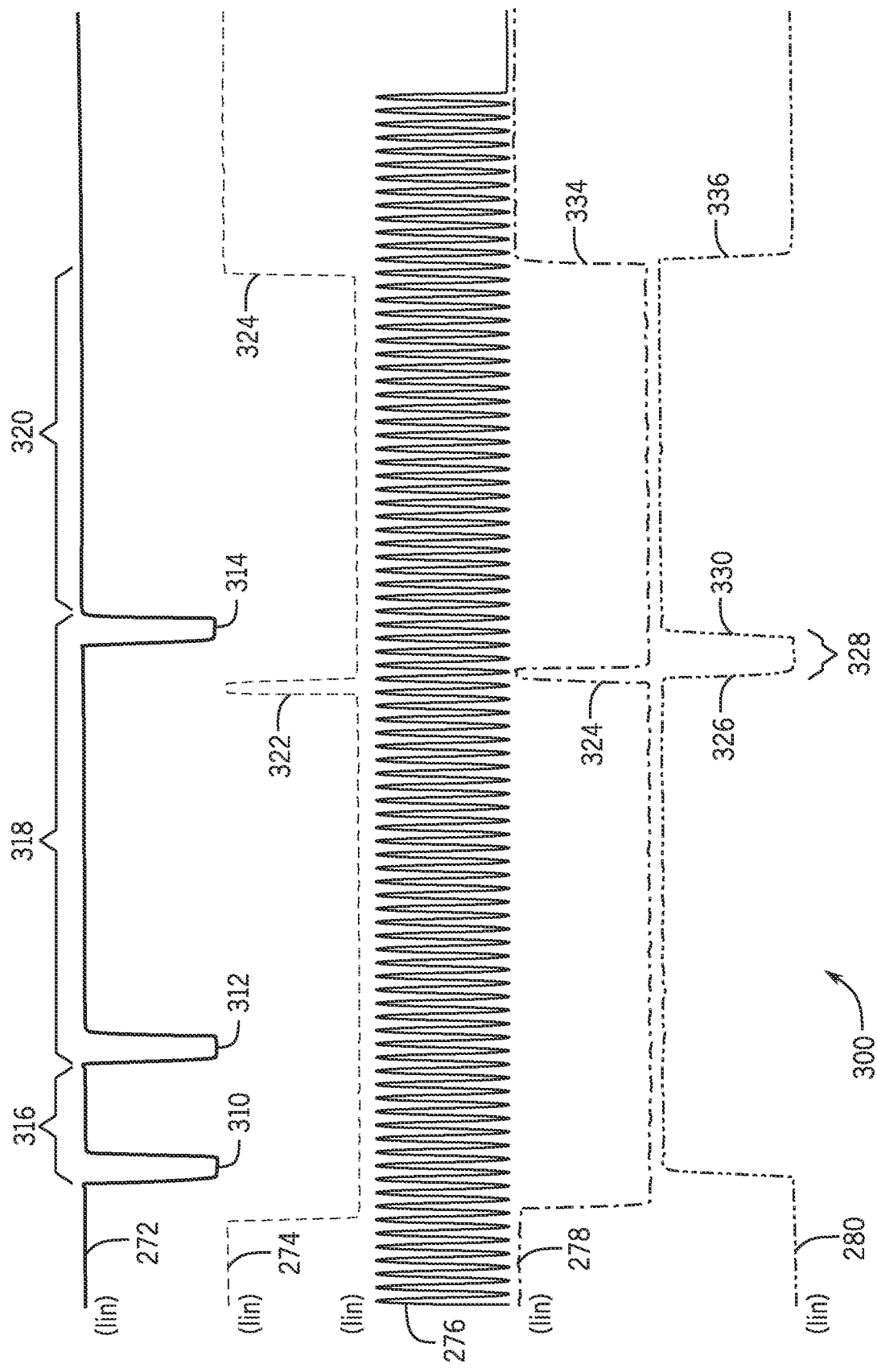
FIG. 6 is a graph of operation of the write shifter of FIG. 3 showing an input buffer enable signal with a write-to-write spacing equal to the threshold amount, according to an embodiment of the present disclosure.

FIG. 6 is a graph 300 of alternate timing that may be used for an embodiment of utilizing the write shifter 60. As illustrated, the graph 300 includes the same lines as the graph 270 with different pulses. Specifically, the graph 300 shows pulses 310, 312, and 314 indicating three different write commands. A write-to-write spacing 316 between the pulses 310 and 312 is similar to the spacing 287 of FIG. 5 (e.g., 8 tCks) causing no change in the DSIBen signal 62. However, a write-to-write spacing 318 between the pulses 312 and 314 is equal to the threshold number (e.g., 31) of tCks. Thus, a pulse 322 is output from the NOR gate 190 indicating that the stages of the write shifter 60 are empty. This pulse, in turn, causes the flip-flop 158 to output a synchronous result of the OR operation that in turn causes the DSIBen signal 62 to be deasserted (e.g., disable the input buffer(s) 48) as shown by falling edge 326. Re-enablement of the input buffer(s) 48 via the DSIBen signal 62 is prevented until a minimum duration 328 elapses after the disabling of the input buffer(s) 48 to allow the 4PCG 47 to fully reset. As previously discussed, this minimum duration 328 may be set by the number of stages after which the turn-on tap point is captured (e.g., 2, 3, or 4 tCks) and may be selectable using a switch 170 or multiplexer. The illustrated minimum duration 328 is 3 tCks but may be any other selected durations. After this minimum duration 328 has elapsed, the DSIBen signal 62 may be allowed to re-enable the input buffer(s) 48 with a rising edge 330 of the DSIBen signal 62.

After the pulse 314, no other write commands are received for the threshold number (e.g., 31) of tCks 320. Accordingly, the stages of the write shifter 60 are empty causing a rising edge 332 for the output of the NOR gate 190 to transition high. The rising edge 332 causes the output of the flip-flop 158 represented by the line 278 to transition high as a rising edge 334 at a next clock cycle of the Ck 162. In other words, the flip-flop 158 synchronizes the output of the NOR gate 190 to the Ck 162. This rising edge 334 causes the flip-flop 160 to output the DSIBen signal 62 with a falling edge 336 to disable the input buffer(s) 48.

Figure 7:
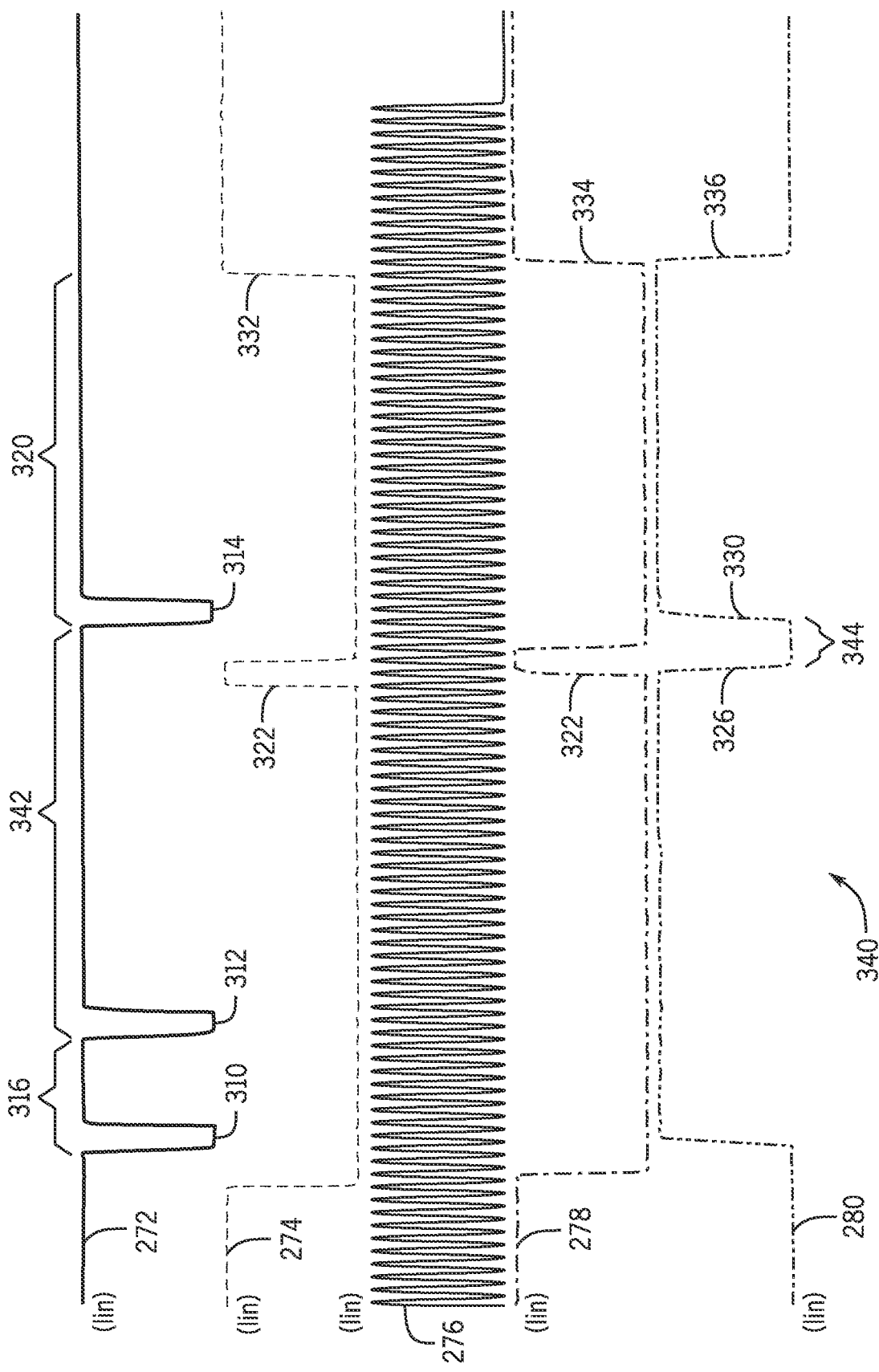
FIG. 7 is a graph of operation of the write shifter of FIG. 3 showing an input buffer enable signal with a write-to-write spacing greater than the threshold amount, according to an embodiment of the present disclosure.

FIG. 7 is a graph 340 that is similar to the graph 300 of FIG. 6 except that a write-to-write spacing 342 is 1 tCk greater than the write-to-write spacing 318 of the graph 300. Due to this extra 1 tCk of write-to-write spacing 342 over the write-to-write spacing 318, a duration of the pulse after falling edge 326 is 1 tCk more than the minimum duration 328. In other words, as previously noted, the input buffer control circuitry 50 increases the disable pulse width by an additional tCk for each additional tCk of write-to-write spacing thereby relaxing with larger write-to-write spacings (and/or with slower tCks).

In some embodiments, the timing of when to launch the command signal into the write shifter 60 may vary based on the frequency of the Ck of the memory device 10. For instance, the command signal may be launched at some number (e.g., 20 tCks) less than a full column address strobe (CAS) write latency (CWL) for the device as the first available point across all speed grades of the memory device 10. However, this point may be too slow for some faster frequencies of operation for the memory device. As such, the input buffer control circuitry 50 may select between two different launch points (e.g., CWL−20 tCks (Q20) and CWL−25 tCks (Q25)) based on the speed grade of the memory device 10.

The data rate setting and/or trim codes for the memory device 10 may be used to determine the inflection point for switching between the slow mode (Q20) of the data input buffer enable to the fast mode (Q25) of the data input buffer enable. Although the following refers to Q25 and Q20 for the respective fast and slow modes, some embodiments may use other launch points and/or may utilize more than two options for potential launch points. Both modes still disable the input buffer whenever the write-to-write spacing is greater than or equal to the number (e.g., 31) tCk. The fast mode just speeds up the entire enable window by a number (e.g., 5 clocks) by using Q25 instead of Q20. The trim codes may be input via a mode register and/or may be set by setting fuses in the memory device 10 to set the speed. For instance, if during manufacture, the silicon tests as fast silicon, a fuse may be set to always use Q20 regardless of whether a data rate setting may otherwise have caused the memory device to use Q25.

Figure 8:
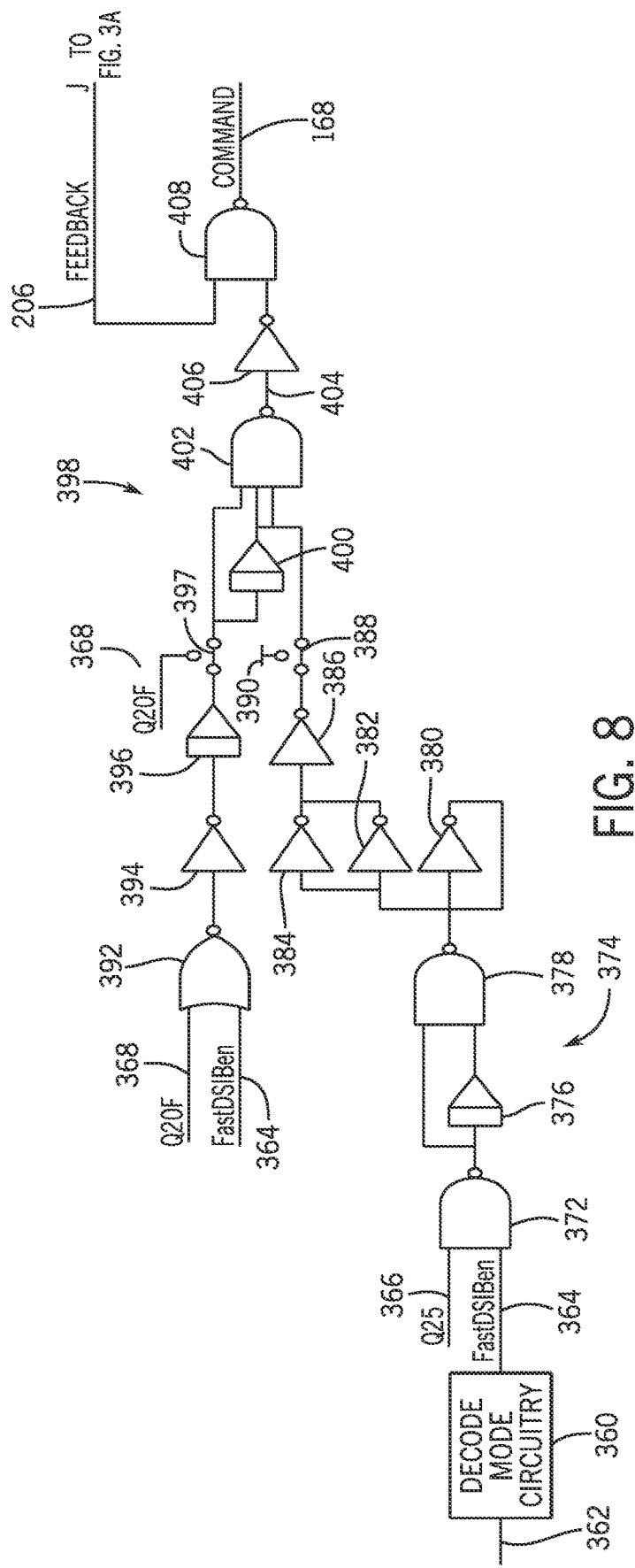
FIG. 8 is a circuit diagram of a portion of input buffer control circuitry used to select whether the input buffer control circuitry operates in a fast mode or a slow mode, according to an embodiment of the present disclosure.

FIG. 8 shows a portion 370 of the input buffer control circuitry 50 that includes decode mode circuitry 360 that determines whether to use the Q20 or Q25. The decode mode circuitry 360 receives an input 362 (e.g., data rate settings, trim codes, fused values, and/or the like). The decode mode circuitry 360 uses this input to decode which mode to use and outputs a FastDSIBen signal 364 that indicates whether Q25 or Q20 is to be used for input buffer controls.

The portion 370 also includes circuitry used to output a Q25 366 that launches a command on the command signal 168 five cycles sooner than if launched using Q20F 368. Q20F 368 may be complementary to Q20 for logic operation purposes in the portion 370. The Q25 366 and the FastDSIBen signal 364 are transmitted to a NAND gate 372 that performs a NAND operation on them and outputs the result to stretching circuitry 374 that includes a delay 376 and a NAND gate 378 where the output of the NAND gate 372 is passed through the delay 376 to the NAND gate 378 and directly to the NAND gate 378 bypassing the delay 376. The stretched output of the NAND gate 378 passes through inverters 380, 382, 384, and 386. The output of the inverter 386 is received at a switch 388 that may be used to enable or disable using the Q25 366 by determining whether to transmit a supply voltage 390 or the output of the inverter 386 for use as the command signal 168.

The Q20F 368 and the FastDSIBen signal 364 are transmitted to a NOR gate 392 as inputs to the NOR gate 392 to perform a NOR operation and output the result to an inverter 394 then to a delay 396 used to match the path for the Q25 366. The output of the delay is transmitted to a switch 397 to determine whether to force the use of the Q20F 368 or use the result from the delay 396. The output from the switch 397 is transmitted to stretching circuitry 398 that includes a delay 400 and a NAND gate 402 where the output of the switch 397 is passed through the delay 400 to the NAND gate 402 and directly to the NAND gate 402 bypassing the delay 400. The NAND gate 402 also receives the output of the switch 388. The NAND gate 402 and the circuitry between the Q25 366 and the Q20F 368 acts to select (e.g., de-multiplex) one as a selected signal 404. The output of the NAND gate 402 when Q20F 368 is selected is also stretched. The selected and stretched signal 404 is inverted in an inverter 406. The inverted selected signal 406 is transmitted to a NAND gate 408 along with the Feedback signal 206. The output of the NAND gate 408 is transmitted as the command signal 168 to the flip-flop 100. Although specific circuitry is depicted in FIG. 8 due to potential availability in certain embodiments of the memory device 10, any suitable configuration to stretch and de-multiplex the signals may be used in some embodiments.

Figure 9:
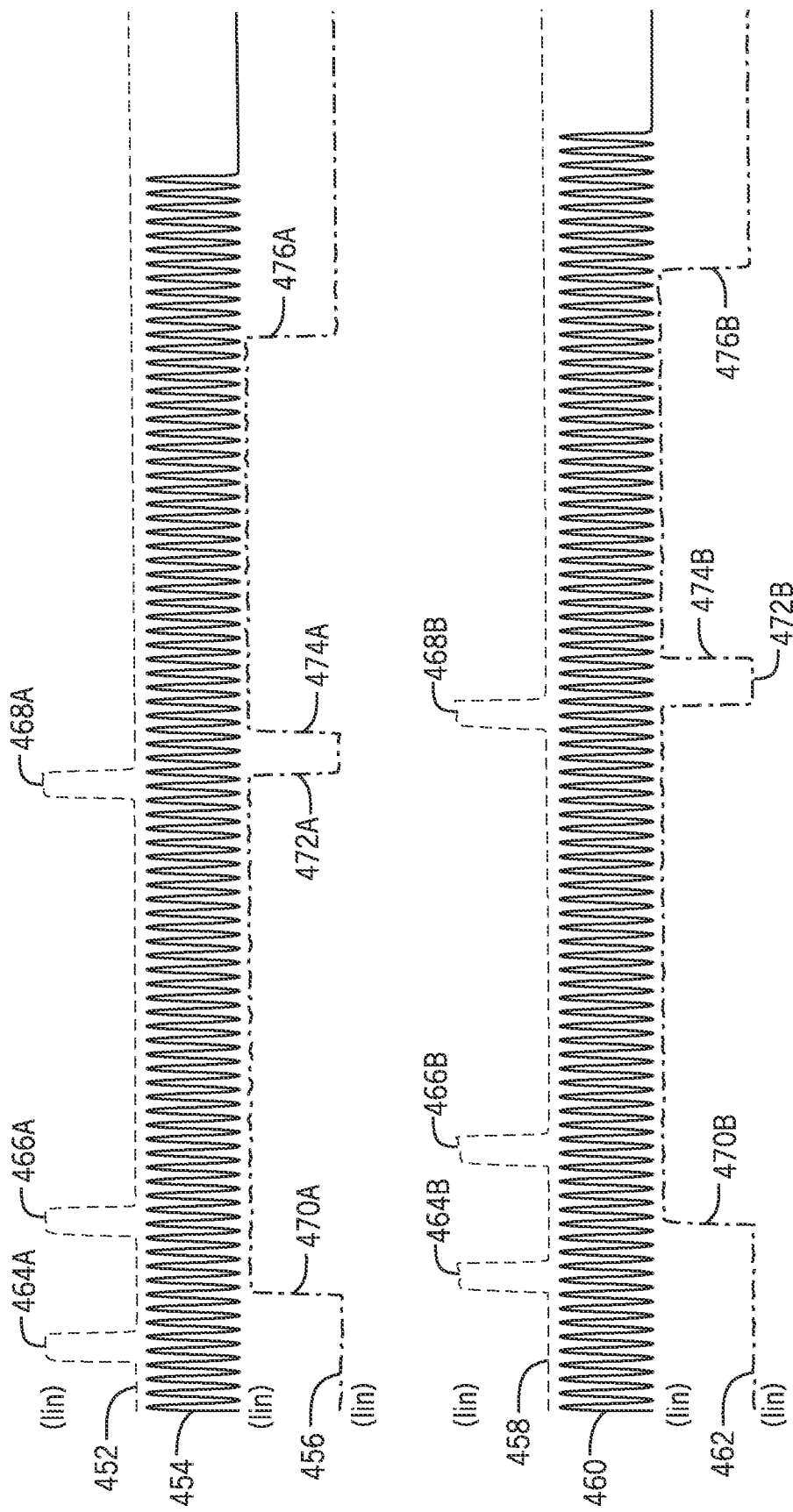
FIG. 9 is a graph of operation of the write shifter of FIG. 3 using the fast mode and the slow mode of FIG. 8, according to an embodiment of the present disclosure.

FIG. 9 shows a graph 450 comparing timing using Q20 and Q25. The graph 450 includes a line 452 corresponding to the command signal 168 using Q25 from the portion 370. The line 454 corresponds to the Ck 162, and the line 456 corresponds to the DSIBen signal 62. Similarly, the graph 450 includes a line 458 corresponding to the command signal 168 using Q20 from the portion 370. The line 460 corresponds to the Ck 162, and the line 462 corresponds to the DSIBen signal 62. Although the lines 454 and 460 are shown having the same frequency, in some embodiments, the line 454 may correspond to a higher frequency possibly requiring utilization of Q25 rather than Q20.

Three write commands are received, as indicated by the pulses 464, 466, and 468 shown with respective pulses 464A, 466A, and 468A for Q25 usage and respective pulses 464B, 466B, and 468B for Q20 usage. As illustrated, the entry into the write shifter 60 for the pulses 464A, 466A, and 468A when using Q25 occurs 5 cycles earlier than the corresponding pulses 464B, 466B, and 468B when using Q20. Similarly, rising edges 470A and 474A and falling edges 472A and 476A when using Q25 occur 5 cycles prior to respective rising edges 470B and 474B and falling edges 472B and 476B when using Q20. In other words, using Q25 causes the commands to enter the write shifter 60 5 cycles earlier also causing the input buffer(s) 48 to be disabled and re-enabled 5 cycles earlier relative to using Q20.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A memory device, comprising:
a command interface configured to receive write commands from a host device;
an input buffer configured to buffer data from the host device;
a write shifter configured to:
receive a first write command of the write commands and shift the first command through the write shifter;
cause the input buffer to be disabled after a first threshold of clock cycles when the first write command has shifted through the write shifter;
receive a second write command; and
prevent the input buffer from being re-enabled until the second write command has shifted through a second threshold of stages of the write shifter.

2. The memory device of claim 1, wherein the write shifter comprises a plurality of serially connected flip-flops through which the first and second write commands are shifted.

3. The memory device of claim 2, wherein each stage of the write shifter comprises a respective one of the serially connected flip-flops.

4. The memory device of claim 3, wherein the write shifter comprises a turn-on tap point sampled from between two of the serially connected flip-flops.

5. The memory device of claim 4, wherein a number of serially connected flip-flops before the turn-on tap point is equal to a number of stages corresponding to the second threshold of stages.

6. The memory device of claim 4, wherein the write shifter comprises a switch to choose different locations in the plurality of serially connected flip-flops for the turn-on tap point.

7. The memory device of claim 3, wherein a total number of flip-flops in the write shifter is equal to a number of clock cycles for the first threshold.

8. The memory device of claim 1, wherein the write shifter comprises logical OR circuitry configured to perform a logical OR of all stages to determine when the first write command has shifted through the write shifter.

9. The memory device of claim 8, wherein shifting through the write shifter comprises the write command shifting through all stages of the write shifter.

10. The memory device of claim 1, comprising mode selection circuitry configured to select between a fast mode for launching write commands to the write shifter and a slow mode for launching write commands to the write shifter.

11. The memory device of claim 10, wherein the mode selection circuitry is configured to select between the fast mode and the slow mode based on a speed grade for the memory device.

12. The memory device of claim 10, wherein the mode selection circuitry is configured to select between the fast mode and the slow mode based on fused values from fuses in the memory device.

13. The memory device of claim 10, wherein the mode selection circuitry is configured to select between the fast mode and the slow mode based on mode register values set by the host device.

14. The memory device of claim 10, wherein the fast mode corresponds to the write command launching into the write shifter one or more clock cycles sooner than the slow mode would launch the write command into the write shifter.

15. A method for operating a memory device, comprising:
   disabling an input buffer;
   receiving, at the memory device, a write command;
   transmitting the write command through a write shifter of the memory device;
   after disabling the input buffer, suppressing enablement of the input buffer until the write command has reached a turn-on tap point in the write shifter; and
   enabling the input buffer after the write command has reached the turn-on tap point in the write shifter.

16. The method of claim 15, comprising selecting a location for the turn-on tap point between two possible locations in the write shifter using a switch coupled to both locations.

17. The method of claim 15, comprising performing an OR of different stages of the write shifter to determine that a previous write command has exited the write shifter to disable the input buffer.

18. The method of claim 15, wherein disabling the input buffer comprises driving an input buffer enable signal to a first logic value and enabling the input buffer comprises driving the input buffer enable signal to a second logic value.

19. The method of claim 18, wherein the first logic value comprises a logic high value and the second logic value comprises a logic low value.

20. A memory device, comprising:
   a command interface configured to receive write commands from a host device;
   an input buffer configured to buffer data from the host device;
   input buffer control circuitry, comprising:
      a plurality of flip-flops configured to receive a first write command of the write commands and shift the first command through the plurality of flip-flops;
      logical OR circuitry configured to receive values from each flip-flop of the plurality of flip-flops and to cause the input buffer to be disabled after the first write command has shifted through all of the plurality of flip-flops; and
      control circuitry configured to prevent the input buffer from being re-enabled after the input buffer is disabled until a subsequently received second write command has shifted through a threshold number of flip-flops of the plurality of flip-flops.

21. The memory device of claim 20, wherein the control circuitry comprises a flip-flop configured to synchronize an OR operation from the logical OR circuitry with a clock of the memory device.

22. The memory device of claim 20, wherein the input buffer control circuitry comprises a switch configured to select between multiple potential turn-on tap point locations, wherein the threshold number of flip-flops corresponds to the selected turn-on tap point location.

23. The memory device of claim 20, wherein the input buffer control circuitry comprises a mode decoder configured to select between a fast mode and a slow mode for the memory device.

24. The memory device of claim 23, wherein the mode decoder is configured to make the selection based at least in part on a speed grade for the memory device or fused values in fuses of the memory device.

25. The memory device of claim 23, wherein the fast mode launches write commands into the plurality of flip-flops after fewer clock than the slow mode launches write commands into the plurality of flip-flops.

* * * * *